United States Patent [19]

Lyons

[11] 4,063,450
[45] Dec. 20, 1977

[54] VOLTAGE CONTROLLED ELECTRONIC FILTER

[75] Inventor: Prentice Coleman Lyons, Cincinnati, Ohio

[73] Assignee: General Electric Company, Lynn, Mass.

[21] Appl. No.: 702,316

[22] Filed: July 2, 1976

[51] Int. Cl.² .............................................. G01N 29/00
[52] U.S. Cl. ...................................... 73/579; 328/167
[58] Field of Search ...................... 73/67.2, 71.2, 116; 328/166, 167; 330/109

[56] References Cited

U.S. PATENT DOCUMENTS

| 3,673,503 | 6/1972 | Parker | 73/67.2 X |
| 3,919,648 | 11/1975 | Uetrecht | 328/167 |

Primary Examiner—Jerry W. Myracle
Attorney, Agent, or Firm—Derek P. Lawrence; Henry J. Policinski

[57] ABSTRACT

The response characteristics of an electronic filter are automatically adjusted as a function of the magnitude of an applied DC voltage to permit the same filter to be used for varying applications. Embodiments for varying the center frequency and Q of the filter are disclosed. The filter has particular utility in vibration monitoring systems wherein the center frequency may be selectively set at a value which is characteristic of the frequency of particular vibration signals of interest. In a disclosed vibration monitoring system incorporating the voltage controlled filter of this invention, which is particularly useful for monitoring vibration levels in gas turbine engines, the magnitude of the DC control voltage is varied as a function of gas turbine rotational velocity. In an alternate embodiment of the vibration monitoring system an adjustable feedback circuit is provided which may be set to reduce variations in phase shift as the center frequency of the filter is varied or alternatively to automatically track a particular center frequency.

11 Claims, 5 Drawing Figures

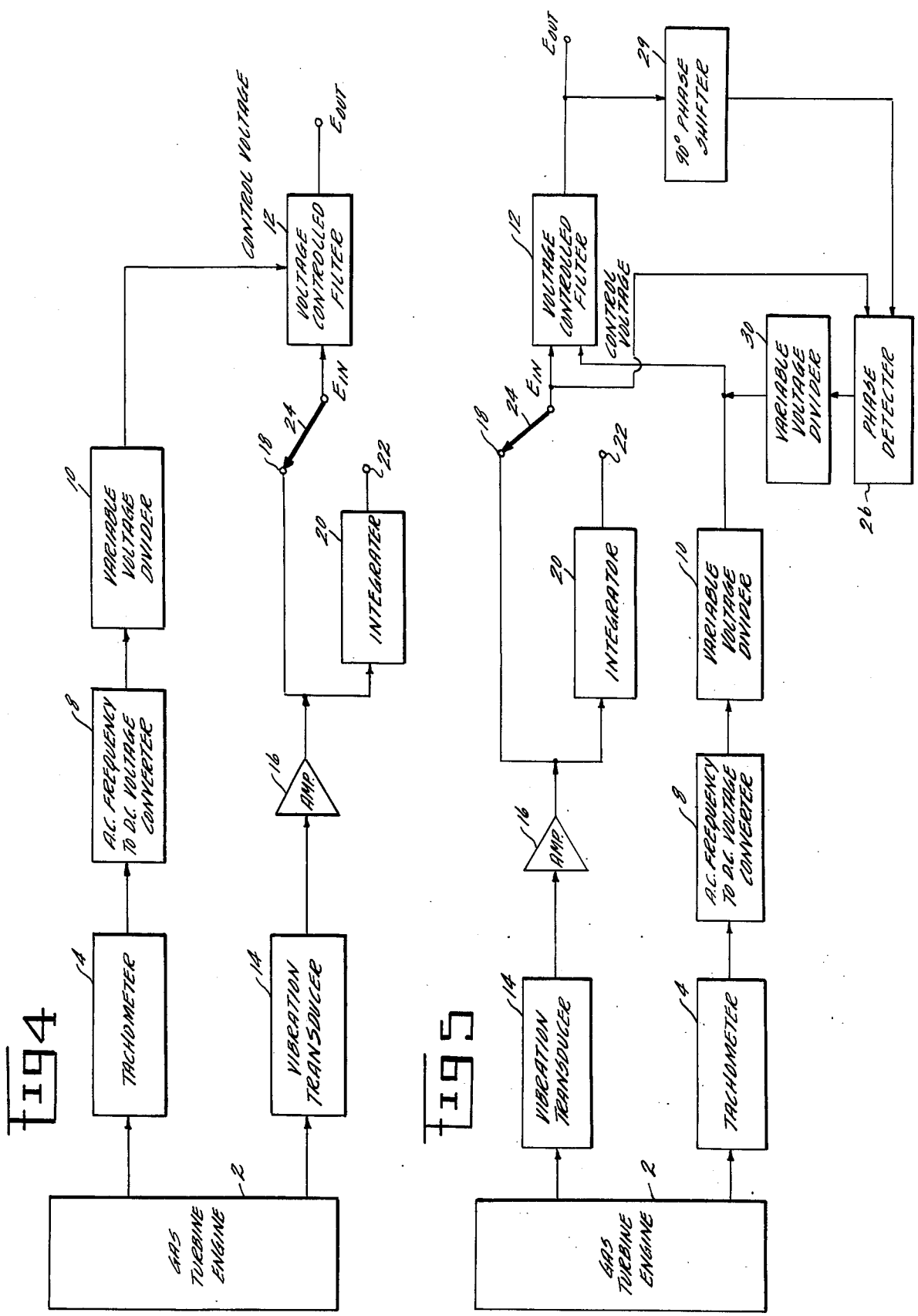

VOLTAGE CONTROLLED ELECTRONIC FILTER

BACKGROUND OF THE INVENTION

There are many applications which require the use of filters whose frequency response characteristics are variable. One such application is that of vibration monitoring. In such vibration monitoring systems, one or more transducers are employed to sense vibration levels and output an AC signal having a frequency content and amplitude which are characteristic of the sensed vibration levels. The output of the vibration transducer is generally input to a filter network which sharply attenuates those signals not within a particular band of frequencies which are characteristic of the vibration signals of interest. When required to measure vibration levels within several different spaced frequency bands, prior art vibration monitoring systems have utilized a variety of techniques. Such techniques have included the use of separate filters, each having a desired response characteristic. Alternatively such prior art vibration monitoring systems have used a single filtering network whose frequency response characteristics may be selectively controlled either manually or automatically. Manually variable characteristic filters are undesirable because of the time required to adjust them. Prior art automatically adjustable filters have generally failed to provide the required accuracy at all frequencies. One such prior art system uses tracking filters which employ super heterodyne techniques. However, super heterodyne tracking filters have exhibited long term instability and lack the accuracy levels generally required for many vibration monitoring applications. Because the super heterodyne tracking filter and other automatically variable characteristic filters of the prior art have generally lacked the accuracy and long term stability required for vibration monitoring techniques, the prior art vibration monitoring systems have generally used separate filtering networks for each filtering characteristic desired or time consuming manually adjustable filtering networks.

It is therefore a primary object of this invention to provide an electronic filter which exhibits high accuracy and long term stability characteristics and which has frequency response characteristics that may be automatically controlled as a function of the magnitude of an applied DC control voltage.

It is a further object of this invention to provide an electronic filter, the center frequency and/or Q of which may be selectively controlled by the magnitude of an applied DC voltage.

It is still a further object of this invention to provide a system for monitoring vibration levels in a gas turbine engine which incorporates the voltage controlled filter of this invention and wherein the center frequency of the filter is automatically varied as a function of gas turbine rotational velocity.

It is a further object of this invention to provide a voltage controlled electronic filter for use in a vibration monitoring system which includes an adjustable feedback circuit which may be set to reduce variations in phase shift as the filter center frequency is varied or alternatively to automatically track a predetermined frequency.

SUMMARY OF THE INVENTION

These and other objects of this invention have been achieved in the preferred embodiments of the invention wherein an electronic filter whose frequency response characteristics are selectively varied by a DC control voltage is provided. The filter has particular utility in a disclosed vibration monitoring system for gas turbine engines.

A known filtering system which utilizes an analog computer to synthesize an RLC second order network is shown in FIG. 1 wherein numbers differing by a ' refer to components of identical value. This filtering circuit is generally referred to as a biquad resonator. The biquad resonator realizes Q values approaching two hundred while retaining the sensitivity and stability characteristic of passive components. The network includes passive components comprising resistors R1, R2, R3, R3', R4 and R4' and capacitors C1 and C1'; and active components comprising operational amplifiers A1, A2, and A3. The center frequency of this filtering network is determined by the values of the resistors R3 and R3' and the capacitors C1 and C1'. The Q of this filtering network is determined by the value of the resistor R2. The gain of the filter is determined by the ratio of the value of resistors R2 and R1. By appropriate selection of the values for these components and the values of the remaining components, this filtering network may be utilized to achieve bandpass, lowpass or highpass filtering with relatively high Q levels.

Applicant's invention improves on the basic characteristics of the biquad resonator by providing circuitry which will permit the center frequency of the resonator to be controlled as a function of the magnitude of an applied DC control voltage. Also disclosed is circuitry which will permit the Q of the resonator to be automatically varied as a function of the magnitude of the DC control voltage and which also maintains filter gain constant as the Q is varied.

The improved voltage controlled filter of this invention has particular utility in a disclosed system for monitoring vibration levels in gas turbine engines. The frequency of vibrations in gas turbine engines is directly proportional to the rotational velocity of the gas turbine. This characteristic enables the voltage controlled filter of this invention to be used to automatically track vibration levels of interest. In the disclosed system, a tachometer is used to sense the rotational velocity of the gas turbine and output an AC signal whose frequency is proportional to the measured rotational velocity. The tachometer output is then input to an AC frequency to DC voltage convertor to produce a DC control voltage having a magnitude proportional to the measured rotational velocity. This voltage is then used to control the center frequency of the voltage controlled filter of this invention such that the filter will pass vibration signals having a frequency within a band of interest and sharply attenuate those signals whose frequency is outside that band. The vibration monitoring system may also include an integrating network for integrating measured vibration signals to derive a vibration displacement signal.

An alternate embodiment for the vibration monitoring system is disclosed which includes an adjustable feedback network which may be adjusted to provide automatic tracking at a selected center frequency or alternatively to reduce variations in phase shift of the filtering network as the center frequency is varied.

BRIEF DESCRIPTION OF THE DRAWINGS

This invention may be better understood upon reading the following description of the preferred embodiments in conjunction with the accompanying drawings wherein:

FIG. 4 is a schematic diagram partially in block format illustrating a system for measuring vibration levels in gas turbine engines which uses the voltage controlled electronic filter of this invention.

FIG. 5 is a schematic diagram partially in block format illustrating an alternate embodiment for the gas turbine engine vibration monitoring system of this invention which incorporates an adjustable feedback circuit.

DESCRIPTION OF THE PREFERRED EMBODIMENTS

Figure 1:
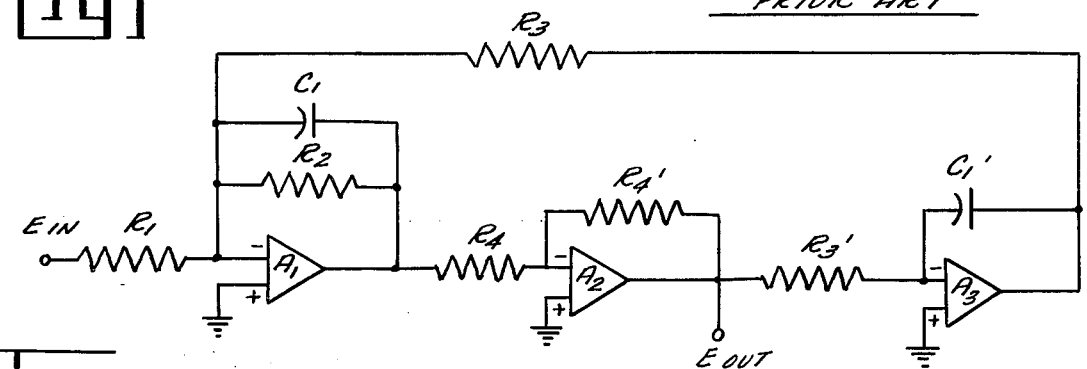
FIG. 1 is a schematic diagram for a prior art biquad resonator.

Referring to FIG. 1 wherein components whose designation differ only by a ' are of identical value therein is shown a prior art biquad resonator filter. The circuit includes series connected amplifiers A1, A2 and A3 and associated passive components comprising resistors R1, R2, R3, R3', R4, R4' and capacitors C1 and C1'. This circuit which essentially comprises a cascade of two integrators may be used to realize a bandpass, lowpass, or highpass filter by appropriate selection of the component values. In the bandpass mode of operation the input terminal $E_{in}$ and output terminal $E_{out}$ are as shown in FIG. 1. The center frequency of this circuit is determined by the values of the resistors R3 and R3' which are of identical value and the capacitors C1 and C1' which are also of identical value. The Q of this filter is determined by the value of the resistor R2. The filter gain is determined by the ratio of R2 and R1.

Figure 2:
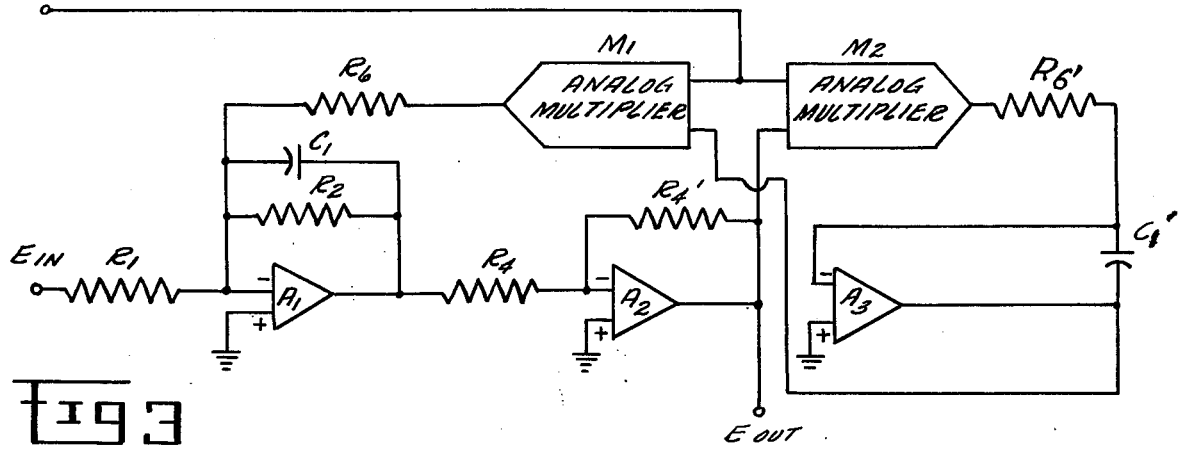
FIG. 2 is a schematic diagram partially in block format illustrating one embodiment of the voltage controlled electronic filter of this invention.

Referring to FIG. 2 wherein like numbers referred to previously identified components therein is shown one embodiment for the voltage controlled electronic filter of this invention. This circuit is essentially that of a bandpass biquad resonator with certain modifications to permit variation of the filtering characteristics of the resonator by the use of a DC control voltage. In the circuit of FIG. 2, the center frequency controlling resistors have been replaced with an analog multiplier and a resistor connected in series with the multiplier output. Thus, the resistor R3 of the biquad resonator of FIG. 1 has been replaced with multiplier M1 and series output resistor R6 while the resistor R3' of the biquad resonator of FIG. 1 has been replaced with multiplier M2 and associated series output resistor R6'. The effective resistance across the multiplier and series output resistor combinations are selectively varied by application of a DC control voltage VT to the respective inputs of the multipliers M1 and M2. The other input of the multiplier M1 is connected to the output of the amplifier A3, and the other input to the multiplier M2 is connected to the output of the amplifier A2. In this manner, the center frequency of the electronic filter of this invention is caused to vary as a function of the magnitude of control voltage VT. A similar result may also be achieved by replacing the frequency controlling capacitors C1 and C1' of FIG. 1 with corresponding voltage controlled capacitors (not shown).

Figure 3:
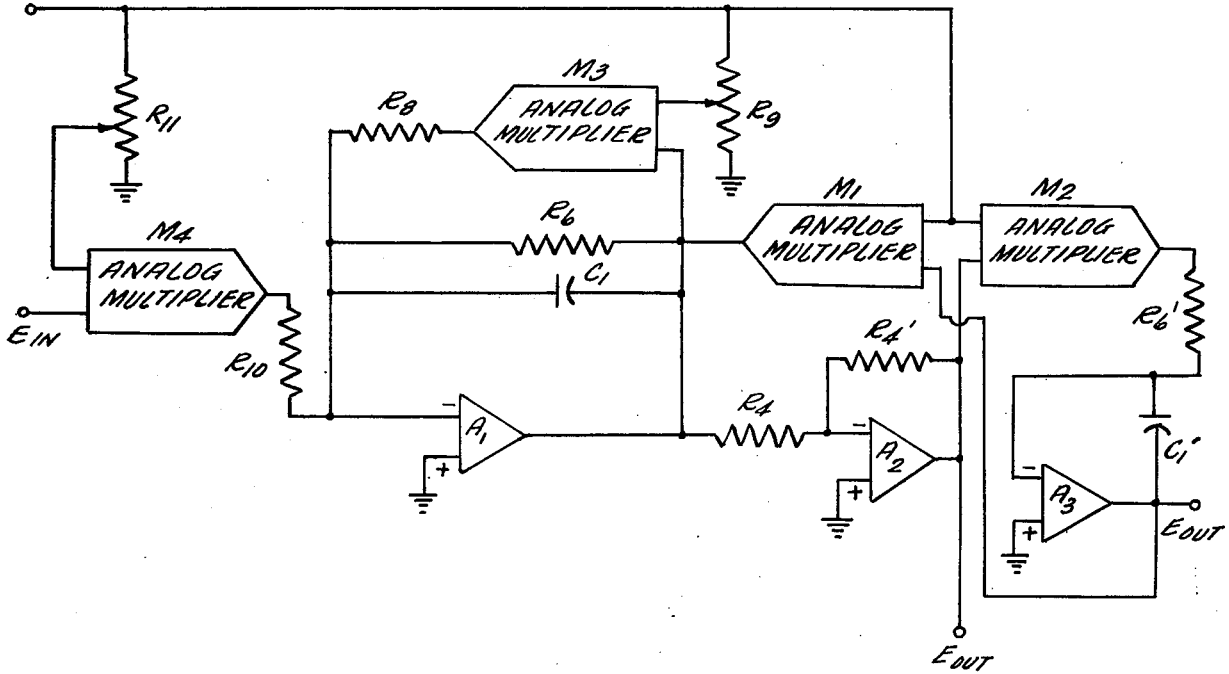
FIG. 3 is a schematic diagram partially in block format illustrating an alternate embodiment for the voltage controlled electronic filter of this invention.

Referring to FIG. 3 wherein like numbers refer to previously identified components therein is shown an alternate embodiment for the voltage controlled electronic filter of this invention which is similar to the embodiment of FIG. 2, but which also permits control of the Q of the filter. In this embodiment the Q determining resistor R2 has also been replaced with an analog multiplier M3 and series output resistor R8. As indicated above, the gain of the biquad resonator of FIG. 1 is determined by the ratio of resistors R1 and R2. Inorder to maintain a constant gain as the Q of the filter of FIG. 3 is varied the resistor R1 has also been replaced with an analog multiplier M4 and series connected output resistor R10. A variable resistance R11 is also provided between the control voltage VT and the input to analog multiplier M4 to serve as a variable voltage divider. The Q varying circuit of FIG. 3 is calibrated by setting the resistance R11 to a value which will cause the ratio of the resistance across analog multiplier M4 and associated series resistor R10 to the resistance across analog multiplier M3 and associated series resistor R8 to remain constant as the Q of the filter is varied. The DC control voltage VT is applied to the input terminals of analog multiplier M3 through variable resistor R9. Resistor R9 is adjusted to obtain the desired change in Q as a function of control voltage VT. The Q of the filter as well as the center frequency is thereby varied as a function of the control voltage VT. Where desired multipliers M3 and M4 and associated resistors R8, R9, R10 and R11 may be used without the multipliers M1 and M2 and associated resistors R6 and R6' to permit variations in Q by control voltage VT without similar variations in the center frequency of the filter.

One application where the voltage controlled filter of this invention is particularly useful is in monitoring vibration levels in gas turbine engines. Vibration monitoring systems for gas turbine engines typically use a vibration transducer attached to a running engine which outputs an AC signal whose frequency content and amplitude are characteristic of the vibration levels in the running engine.

In gas turbine engines, the frequency of measured vibration signals is directly proportional to the rotational velocity of the gas turbine. Thus, at relatively low rotational velocities the frequency levels of vibration signals output from the vibration transducer applied to the engine are significantly lower than the frequency levels output from the vibration transducer at relatively high engine rotational velocities. The system disclosed in FIG. 4 uses this characteristic of the vibrations signals of gas turbine engines to automatically adjust the frequency response of the vibration measuring system such that only those signals of particular interest are received at the output of the system. This is accomplished through the use of the disclosed voltage controlled electronic filter. In the disclosed system, a tachometer 4 is applied to a gas turbine engine 2 to sense the rotational velocity of the gas turbine. The AC signal output from the tachometer is input to an AC frequency to DC voltage converter 8 to derive a DC voltage having an amplitude proportional the rotational velocity of the gas turbine. The DC signal is thereafter input to a variable voltage divider 10 which may be used to adjust the sensitivity of the control voltage. The DC voltage output from the divider 10 is applied to the control line of the voltage controlled electronic filter 12. In this manner, the center frequency and/or Q of the filter 12 are varied as a function gas turbine rotational velocity.

Engine vibration is detected by a vibration transducer 14. The AC signals output from vibration transducer 14 are amplified by a conditioning amplifier 16 and thereafter applied to a terminal 18 and also to the input of an integrator 20. The signals output from the integrator 20 are output to a terminal 22. A switch having one end connected to the input of the voltage controlled filter 12 and the other end switchable between the terminals 18 and 22 is provided to permit the same system to be used for measuring the velocity of vibration via terminal 18 or the displacement of vibration via terminal 22. The vibration signals output from the filter 12 may be applied to a recorder, oscilloscope or other device (not shown) for monitoring or measuring purposes. This arrangement permits the center frequency and/or Q of the filter 12 to automatically be controlled as a function of the rotational velocity of the gas turbine engine 2 to which the tachometer 4 and vibration transducer 14 are attached and thereby enables the filter 12 to pass only those signals of particular interest.

Referring to FIG. 5 wherein like numbers refer to previously identified components therein is shown an alternate embodiment for the vibration monitoring system of this invention which uses an adjustable feedback network to provide automatic tracking about a selected frequency or alternatively to provide automatic phase shift compensation as the filter center frequency is varied. In this embodiment, the output of the voltage controlled filter 12 is connected through a 90° phase shifter 29 to one input of a phase detector 26 which has a second input connected to the input to voltage controlled filter 12. Signals output from the phase detector 26 are directed through a variable voltage divider network 30 to combine with the DC control voltage input to the filter 12. This embodiment permits variations in phase shift as a function of operating frequency to be eliminated. Signals input to the voltage controlled filter 12, and signals output from the voltage controlled filter 12 shifted in phase 90° are input to the phase detector 26 to produce an output signal whose DC voltage is a function of the phase shift between the input and output of the voltage controlled filter 12. The degree of control of this feedback voltage may be varied by suitably adjusting the variable voltage dividers 30 and 10. When the output from the voltage divider 30 is relatively large as compared to the signal output from the voltage divider 10 this embodiment acts as a center frequency tracking device wherein the center frequency of the voltage control filter 12 is maintained at a desired level determined by the magnitude of the DC control voltage applied to the filter 12. Alternatively, when the output from the voltage divider 30 is relatively small as compared to the signal output from the voltage divider 10 this embodiment acts to correct phase error as the center frequency is shifted by variation in the control voltage from the voltage divider 10 and thereby avoid tracking unwanted frequencies. Thus, the degree to which the phase error signal has control of the filter center frequency can be varied from 0 to 100 percent by adjusting the voltage divider networks 10 and 30. A 100% control of the center frequency results in automatic tracking of the voltage control filter 12 about a selected center frequency while small amounts of feedback is used to correct variations in phase shift.

The novel voltage controlled filter 12 of this invention permits the vibration monitoring systems of FIG. 4 and 5 to be used to measure the characteristics of vibration signals in differing frequency bands without the need to manually adjust or utilize separate filters for each frequency range of interest. Further the disclosed voltage controlled filter has been demonstrated to maintain errors of less than one percent over a frequency range of one decade. Further, the voltage controlled filter of this invention has demonstrated tuning accuracies as small as 2 percent. By suitably adjusting voltage divider 30 of the embodiment of FIG. 5, phase error variations as a function of center frequency may be significantly reduced.

Various changes could be made in the structures shown in FIGS. 2 through 5 without departing from the scope of this invention. Thus while only a single biquad resonator circuit has been shown two or more resonator circuits in series may be used to achieve the desired filtering characteristics. Further each such resonator circiuit may be modified as taught by this invention to permit automatic variation in the center frequency and/or Q of the filtering network. Further, while the voltage controlled filter of this invention has been shown as incorporated into a vibration monitoring system, the filter has a wide range of applications to any system requiring a variable response filtering network.

Therefore, having described preferred embodiments of the invention, though not exhaustive of all possible equivalents, what is desired to be secured by Letters Patent of the United States is claimed below:

What is claimed is:

1. An electronic filtering system comprising:
   an active filtering network having adjustable response characteristics;
   means for varying the Q of the filtering network as a function of the magnitude of an applied DC voltage, and
   means for maintaining the gain of the filtering network constant as the Q is varied.

2. An electronic filtering system comprising:
   an active filtering network having adjustable response characteristics;
   means for varying the center frequency of the filtering network as a function of the magnitude of an applied DC voltage;
   wherein the filtering network comprises a cascade of two integrators which includes first and second operational amplifiers interconnected by a first resistor, and a third operational amplifier; and
   the center frequency varying means comprises a first two input analog multiplier having one input connected to the output of the third operational amplifier, the other input connected to a DC control voltage and an output connected to the input of the first operational amplifier through a second series resistor, and a second two input analog multiplier having one input connected to the output of the second operational amplifier, the other input connected to the DC control voltage and an output connected through a third series resistor to the input of the third operational amplifier.

3. The electronic filtering system of claim 2 further comprising means for varying the Q of the filtering network.

4. The filtering network of claim 3 wherein the Q varying means comprises:
   a third two input analog multiplier having one input connected to the DC control voltage through a first voltage dividing means, the other input connected to the output of the first operational amplifier and an output connected through a fourth series resistor to the input of the first operational amplifier, and a fourth two input analog multiplier having one input connected to the DC control voltage through a second voltage dividing means, the other input for receiving input signals to the filtering network and an output connected through a fifth series resistor to the input of the first operational amplifier.

5. A system for monitoring vibration levels in gas turbine engines comprising:

transducer means for producing AC output signals having a frequency content and amplitude proportional to the velocity of measured vibration levels, bandpass filtering means having a center frequency which may be varied as a function of an applied DC voltage for receiving the signals output from the transducer means and outputting vibration signals within the filter pass band, and means for automatically controlling the center frequency of the bandpass filtering means as a function of the rotational velocity of the gas turbine engine.

6. The vibration monitoring system of claim 5 wherein the center frequency control means comprises:

tachometer means for producing an AC signal whose frequency is proportional to the rotational velocity of the gas turbine, means for converting the AC signal to a DC control voltage having a magnitude proportional to the frequency of the converted AC signal, and means for applying the control voltage to the bandpass filtering means.

7. The vibration monitoring system of claim 6 wherein the frequency control means further comprises voltage divider means for selectively attenuating the DC control voltage.

8. The vibration monitoring system of claim 6 further comprising:

means for amplifying the AC signals output from the transducer means, means for integrating the amplified AC signals, and switch means for alternatively connecting the input of the bandpass filtering means directly to the output of the amplifying means or to the output of the integrator means.

9. The vibration monitoring system of claim 5 further comprising;

variable feedback means for reducing variations in phase shift of the output of the filtering means as its center frequency is varied.

10. The vibration monitoring system of claim 9 wherein the variable feedback means may be set at a value which causes the center frequency of the filtering means to automatically track a predetermined frequency.

11. The vibration monitoring system of claim 9 wherein the variable feedback means comprises:

a 90° phase shifter having an input connected to the output of the filtering means, and a two input phase detector having one input connected to the output of the 90° phase shifter, the other input connected to the output of the transducer means, and an output connected through a variable voltage divider to the voltage control input of the bandpass filtering means.

* * * * *